(12) United States Patent  (10) Patent No.: US 7,044,198 B2
Matsushima et al.  (45) Date of Patent: May 16, 2006

(54) ELECTRONIC APPARATUS (75) Inventors: Hitoshi Matsushima, Ryugasaki (JP);
Shinji Matsushita, Chigasaki (JP);
Ichirou Asano, Seto (JP); Tsunenori Takeuchi, Okazaki (JP); Osamu Suzuki, Chiyoda (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/792,690

(22) Filed: Mar. 5, 2004

(65) Prior Publication Data

US 2005/0126752 A1   Jun. 16, 2005

(30) Foreign Application Priority Data

Dec. 2, 2003 (JP) .............................. 2003-402369

(51) Int. Cl.
*F28F 7/00* (2006.01)
*F28F 3/12* (2006.01)
*B21D 53/04* (2006.01)

(52) U.S. Cl. ...................... 165/80.4; 165/170; 361/699

(58) Field of Classification Search ................ 165/80.4, 165/80.3, 185, 104.33, 104.34, 166, 170; 361/699, 698, 700, 701, 702, 703; 257/714, 257/715

See application file for complete search history.

(56) References Cited

U.S. PATENT DOCUMENTS

| 4,468,717 | A | * | 8/1984 | Mathias et al. ............. 361/702 |
| 4,561,040 | A | * | 12/1985 | Eastman et al. ............ 361/699 |
| 4,705,102 | A | | 11/1987 | Kanda |
| 4,910,642 | A | * | 3/1990 | Downing ..................... 361/690 |
| 5,050,037 | A | * | 9/1991 | Yamamoto et al. ......... 361/699 |
| 5,274,920 | A | * | 1/1994 | Matthews .............. 29/890.039 |
| 5,423,376 | A | * | 6/1995 | Julien et al. ............... 165/80.4 |
| 5,815,370 | A | * | 9/1998 | Sutton ........................ 361/699 |
| 5,832,989 | A | | 11/1998 | Osakabe |
| 6,152,213 | A | * | 11/2000 | Suzuki .................. 165/104.33 |
| 6,152,215 | A | * | 11/2000 | Niggemann ................. 165/166 |
| 6,166,907 | A | * | 12/2000 | Chien ......................... 361/699 |
| 6,863,119 | B1 | * | 3/2005 | Sugito et al. .......... 165/104.33 |
| 2001/0004370 | A1 | | 6/2001 | Miyajima |
| 2002/0135979 | A1 | | 9/2002 | Estes |

FOREIGN PATENT DOCUMENTS

| EP | 1 244 145 | 9/2002 |
| JP | 09-102568 | 4/1997 |

* cited by examiner

*Primary Examiner*—Tho Duong
(74) *Attorney, Agent, or Firm*—Antonelli, Terry, Stout and Kraus, LLP.

(57) ABSTRACT

A liquid cooling jacket and a system for use in an electronic apparatus, preferable in the cooling capacity or performance, with less in man-hour and manufacturing costs in need of process thereof, and applicable into a narrow space, wherein a plural number of lamination plates, each being formed through the punching process, are piled up in the width direction thereof, for each piece thereof, and are bonded with each other. A cooling liquid flows in a flow passage defined between the laminating plates, and the laminating plates themselves function as a cooling fin.

3 Claims, 8 Drawing Sheets

A-A CROSS-SECTION

FIG.1(c)

B-B CROSS-SECTION

ELECTRONIC APPARATUS

BACKGROUND OF THE INVENTION

The present invention relates to an electronic apparatus having a cooling system of a heat-generation element thereof.

Disclosure is made on the structure of a conventional liquid cooling jacket for use in an electronic apparatus, for example, in the following patent documents 1 and 2.

In those patent documents 1 and 2, for the purpose of making an improvement of heat conductive performance or capacity on the liquid side, there is shown the structure, in which a plate-like cooling fin is provided or an injection nozzle is provided, within a cooling liquid passage thereof. For forming the cooling fin, in general, the cutting process is used in many cases; therefore it rises up labor and manufacturing costs necessary for that processing thereof.

On the other hand, with a method for processing with relatively low costs, such as extruding process, for example, but there is a limit in the height and the pitch of the fins, which can be processed; therefore, it is difficult to maintain the cooling performance or capacity thereof to be favorable.

Also, with the structure of providing the injection nozzle, it increases the thickness of the liquid cooling jacket; therefore it is difficult to apply it, in particular, into a narrow space.

In the following patent document 3, there is disclosed a heat sink, being constructed by piling up lamination plates in a direction of the thickness thereof. However, this patent document 3, since it pays the consideration onto, mainly, such as preventing the generation of defects, and/or improvement on an evenness of temperature within the flow passages, therefore there is made no mentioning about a promotion of heat transfer, through an increase of the heat transfer area within the flow passage itself and/or an improvement on the heat transfer coefficient thereof.

In the following patent document 4, there is disclosed the structure of a heat sink, applying a lamination plate formed by the press processing. However in the patent document 4, there is made no mentioning about the promotion of heat conductivity or transfer within the flow passage itself.

In the following patent document 5, there is disclosed the structure of a liquid cooling heat sink, in which an inner fin is inserted therein, for obtaining the promotion of heat transfer of the flow passages itself. However, with the patent document 5, since a brazing material is put therebetween, which has remarkably low heat conductivity, then heat transmission in the direction perpendicular to a base surface is obstructed at this portion, and therefore it is impossible to obtain such the inner thermal resistance that can be obtained when it is formed into a one body, which is processed through the cutting process.

Patent Document 1: Japanese Patent Laying-Open No. Hei 8-279578 (1996), in particular page 5 and FIGS. 1–5;

Patent Document 2: Japanese Patent Laying-Open No. Hei 8-31994 (1996), in particular pages 6–7 and FIGS. 1–4;

Patent Document 3: Japanese Patent Laying-Open No. Hei 9-102568 (1997), in particular page 4 and FIG. 1;

Patent Document 4: Japanese Patent Laying-Open No. 2003-7944 (2003), in particular pages 2–3 and FIG. 2; and Patent Document 5: Japanese Patent Laying-Open No. 2002-170915 (2002), in particular pages 2–4 and FIGS. 1–5.

As was mentioned above, it must be said that the structure is already known, in which a thin films made of a metal are laminated in the thick direction, so as to form a flow passage within an inside thereof, in the patent document 3 mentioned above.

However, this patent document 3 never mention about the promotion of heat transfer of the flow passage itself.

Thus, a purpose of that invention disclosed in the patent document 3 is to prevent a heat sink of lamination plate type from generating the defects therein, and also to obtain an improvement on reliability and cooling capacity of an apparatus or equipment, by installing that heat sink therein, as was described in the column "Problems to be Solved" in the specification thereof.

And, in the patent document 3, a pair of end plates are provide, for holding a flow passage plate and a communicating plate from both sides thereof, and further they are disposed at positions corresponding to the flow passage of high temperature and that of low temperature, thereby achieving an averaging of temperature.

In this manner, though the patent document 3 talks about an improvement on the cooling capacity, however it is impossible to promote or enhance the heat conductivity of the heat sink by itself.

BRIEF SUMMARY OF THE INVENTION

Accordingly, an object according to the present invention is to provide an electronic apparatus having a liquid cooling jacket and a liquid cooling system, for use in cooling thereof, with aiming a promotion or enhancement of heat transfer as well as thermal conductivity of a flow passage itself.

For accomplishing the object mentioned above, according to the present invention, there is provided a liquid cooling system, comprising: a heat-receiving element, being thermally connected with a heat-generation part; a pump for transporting a liquid to said heat-receiving element; and a radiator for receiving heat from said heat-generation part with an aid of said pump, and for radiating heat of the liquid, wherein: said heat-receiving element is made up with a lamination plate, being formed through punching process, and said lamination plate comprises a flow passage, within which the liquid communicates and are provided a plural number of fins.

Also, according to the present invention, for accomplishing the above-mentioned object, in the liquid cooling system, as mentioned above, wherein: said lamination plate has a first lamination plate having a hole at a central portion thereof, and a second lamination plate having an opened cut-out portion at one end thereof and a hole at other thereof, and said first and second lamination plates are piled up alternately, thereby forming a lamination group of an inlet side of the liquid and another lamination group of an outlet side of the liquid.

And also, according to the present invention, for accomplishing the above-mentioned object, in the liquid cooling system, as mentioned above, wherein: said lamination plate is made up with metal thin-plates, each having a plural number of holes in a longitudinal direction thereof, being shifted into one side in the longitudinal direction with respect to a central portion thereof, being piled up one by one, while reversing the metal thin-plate upside down.

Further, according to the present invention, for accomplishing the above-mentioned object, in the liquid cooling system, as mentioned above, wherein: said lamination plate is made up with metal thin-plates, each having a zigzagging one (1) piece of hole, being shifted into a one side with respect to a central portion thereof, being piled up one by one, while reversing the metal thin-plate upside down.

And further, according to the present invention, for accomplishing the above-mentioned object, in the liquid cooling system, as mentioned above, wherein: said lamination plate is made up with two (2) pieces of metal plates being laminated vertically, and an upper metal plate of those two (2) metal plates laminated vertically has a one (1) piece of zigzagging groove and a hangover portion, which is formed through extrusion forming within an inside of said groove, and said upper metal plate is fixed on a plate-like lower metal plate, putting a sealing member therebetween.

And, for accomplishing the object mentioned above, according to the present invention, there is also provided a liquid cooling system, comprising: a heat-receiving element, being thermally connected with a heat-generation part; a pump for transporting a liquid to said heat-receiving element; and a radiator for receiving heat from said heat-generation part with an aid of said pump, and for radiating heat of the liquid, wherein: said heat-receiving element is made up with a lamination plate, being formed through punching process, and said lamination plate comprises a flow passage, within which the liquid communicates and are provided a plural number of fins, and further said pump and said radiator are connected with said heat-receiving member through conduits.

And, further according to the present invention, for accomplishing the above-mentioned object, in the liquid cooling system, as mentioned above, wherein: a fin is attached onto said radiator.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

Hereinafter, embodiments according to the present invention will be fully explained, sequentially, by referring to the attached drawings.

[Embodiment 1]

Explanation will be made on the first embodiment of the present invention, by referring to FIGS. 1–3.

Figure 1A:
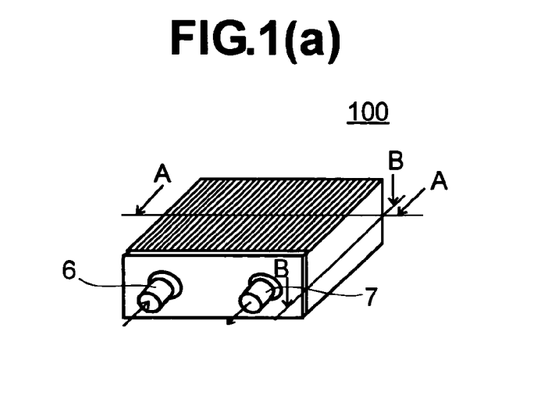
FIGS. 1(a) to (c) are views for explaining a liquid cooling jacket for use of cooling for an electronic apparatus, according to a first embodiment of the present invention.
Figure 1B:
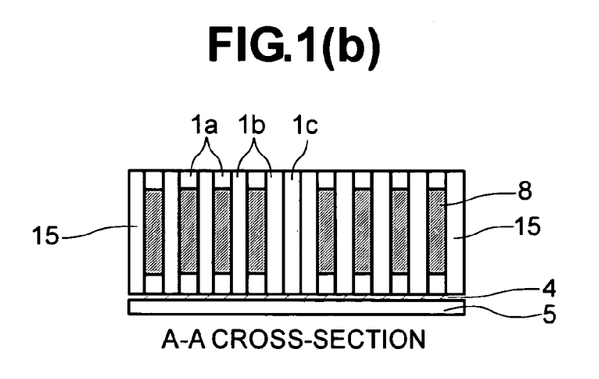
Figure 1C:
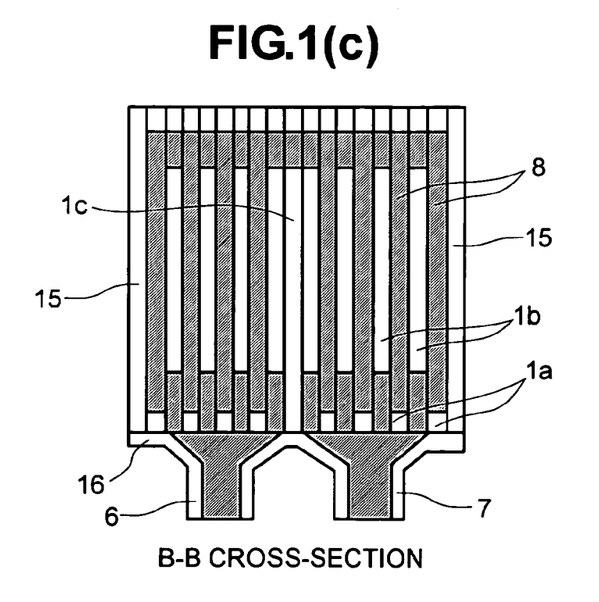

FIGS. 1(a) to 1(c) are views, including a perspective view of a liquid cooling jacket applying the first embodiment therein and the cross-section views of each part thereof.

Figure 2:
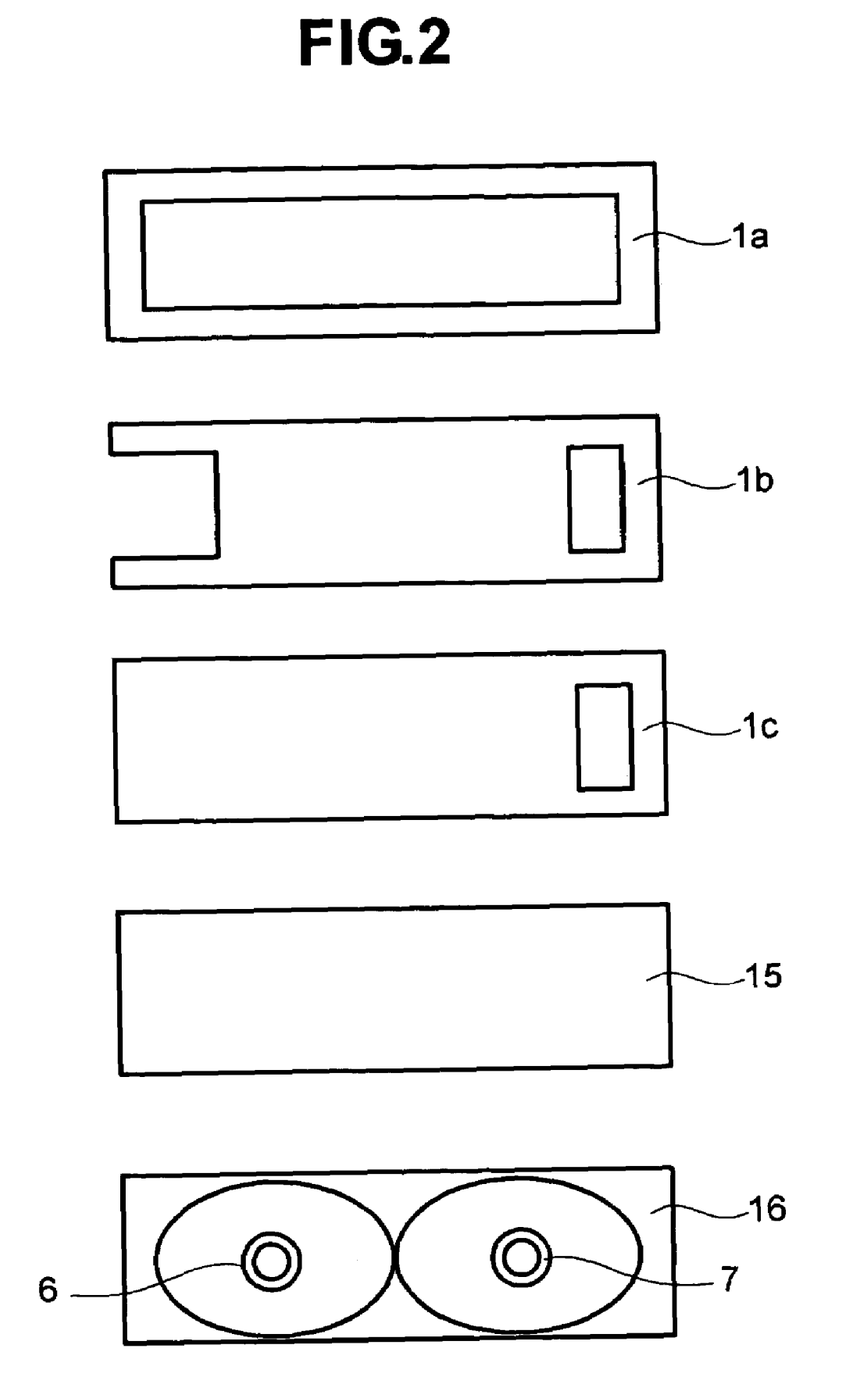
FIG. 2 is a front view of lamination plates to be used in the first embodiment mentioned above.

FIG. 2 is a front view for showing the configuration of a lamination plates, building up the liquid cooling jacket shown in FIGS. 1(a) to 1(c).

Figure 3:
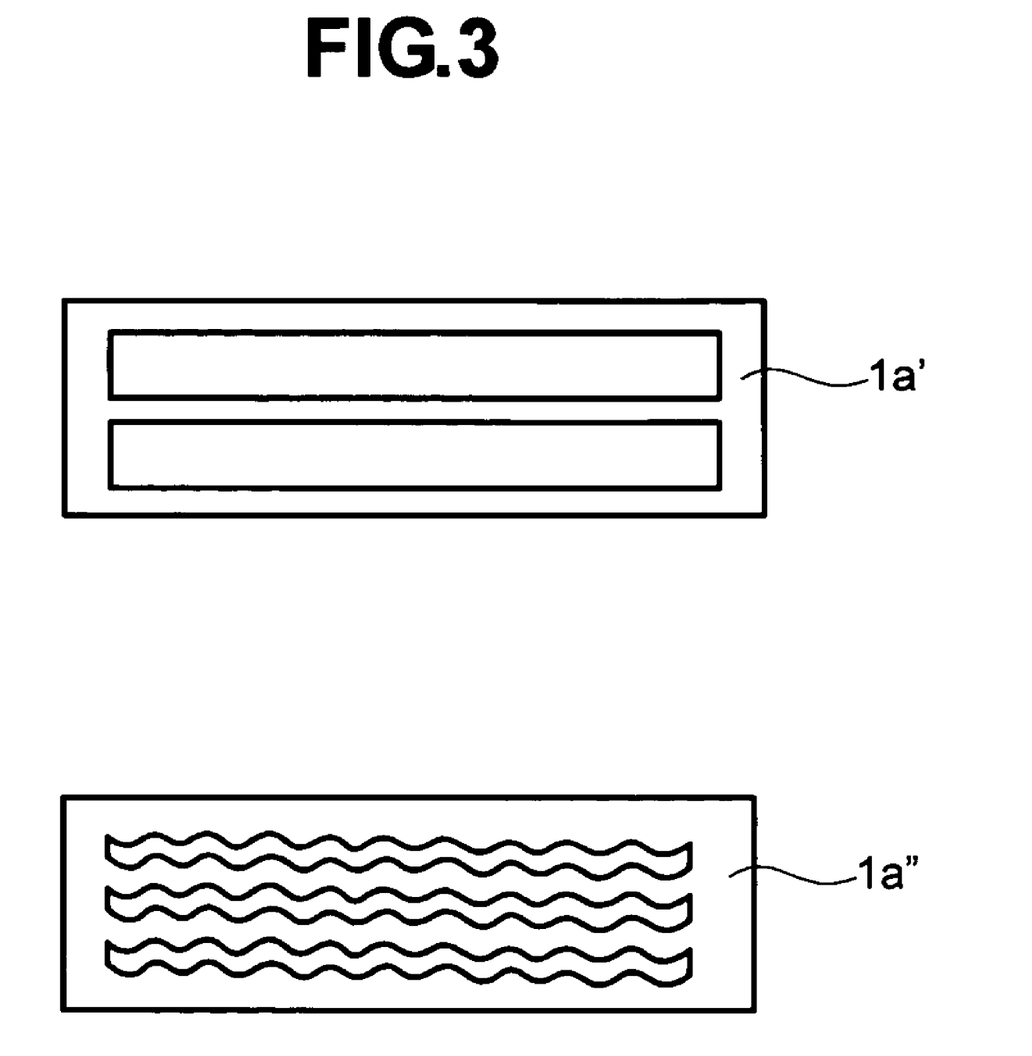
FIG. 3 is a front view of a variation of the lamination plates to be used in the first embodiment mentioned above.

FIG. 3 is a view corresponding to FIG. 2 mentioned above, for explaining a variation of the lamination plates.

In FIGS. 1(a) to 1(c), the liquid cooling jacket 100, according to the present embodiment, is made up by bonding lamination plates 1a, 1b and 1c made from a thin plate of a metal having superior heat conductivity, such as, copper, for example, which are formed through the punching process (the configurations thereof will be explained in more details, by referring to FIG. 2), being piled up in the direction of thickness thereof for an each piece thereof. Within the portion of openings of the lamination plates 1a, 1b and 1c are defined flow passages 8 of a cooling liquid. On both ends of the lamination plates 1a, 1b and 1c are attached side end plates 15. Also, at one end of the lamination plates 1a, 1b and 1c piled up, in the longitudinal direction thereof, an end plate 16 is attached thereto. This end plate 16 defines a portion where an inlet portion 6 and an outlet portion 7 are formed for the cooling liquid.

This liquid cooling jacket 100 is thermally connected with a semiconductor module 5, through a heat conduction member 4.

After piling up the lamination plates 1a, 1b and 1c, one by one, they are held on both sides by the side end plates 15, and further attached with the end plate 16 forming the inlet/outlet portions at the one end of the lamination plates 1a, 1b and 1c, thereby forming a liquid cooling jacket 100 through brazing them, as a whole.

In this liquid cooling jacket 100, the cooling liquid flows within the flow passage 8 defined between the lamination plates 1a and 1b; therefore, the lamination plates 1b has a kind of a cooling fin of the function thereof. With such the structure, it is very easy to make the lamination plates 1a and 1b being thin in the thickness thereof, and therefore a large heat conductive area can be maintained therewith.

Also, the lamination plates 1a and 1b reaches up to the position in contact with the heat conduction member 4, it is possible to eliminate an ill influence upon the heat transmission in the direction perpendicular to the base surface of the brazing material having the low heat conductivity thereof. For this reason, it is possible to obtain a low inner thermal resistance corresponding to that, which can obtained through the cutting process of forming a one body taking a high manufacturing cost thereof; therefore, it is possible to obtain very preferable cooling capacity for the sake of a semiconductor module 5.

The liquid cooling jacket 100 is, basically, made up with only one (1) kind of the lamination plate 1 punched out, and it includes no process therein in need of man-hour, such as, needed in the cutting process, for example; therefore there is a merit that the cost can be reduced down, greatly, which is necessary for manufacturing and processing thereof, comparing to that of the conventional art. It is also possible to keep the thickness of the liquid cooling jacket 100 to be thin in a ratio to the heat conduction area obtained therefrom.

In FIG. 2, the lamination plate 1a is punched out to be square in the shape thereof, and is put into between the respective lamination plates 1b piled up in a plural number thereof, so as to form a spacer between the lamination plates 1b. This lamination plates 1b are cut out at a portion opposing to the inlet portion 6 thereof, and this cut-out portion defines an enter portion for a liquid. A portion opposing to this cut-out portion is punched out to be also square in the shape thereof. This punched-out portion defines a passage, through which the liquid moves in the horizontal direction. As was mentioned in the above, since this lamination plate 1b has a large contact area with the cooling liquid, therefore it has a function of, such as, a kind of a cooling fin. The lamination plate 1c is partitioning the lamination plates 1a and 1b in the central portion thereof, so that it divides them into a group of the lamination plates 1a and 1b opposing to the inlet portion 6 and a group of the lamination plates 1a and 1b opposing to the outlet portion 7.

The liquid cooling jacket 100, which is built up with such the lamination plates 1a, 1b and 1c, is sealed up on both sides thereof, with an aid of the side end plates 15. The cut-out portion of the lamination plate 1b defines the inlet portion and the outlet portion of the cooling liquid, and therefore an end plate 16, on which the inlet portion 6 and the outlet portion 7 are formed, is attached thereto, so that it covers the cut-out portion.

In FIG. 3, the passages of the cooling liquid is divided into the vertical direction within the lamination plate 1a'. The passages of the cooling liquid, being divided into the vertical direction in a plural number, are further formed in a waveform-like in the shape thereof, within the lamination plate 1a".

With this, it is possible to bring the flow within the flow passage to be complex, thereby obtaining an improvement on the mechanical strength and/or a promotion on the heat transfer at the fin surface, as well as, thermal conduction within fins thereof.

[Embodiment 2]

Figure 4A:
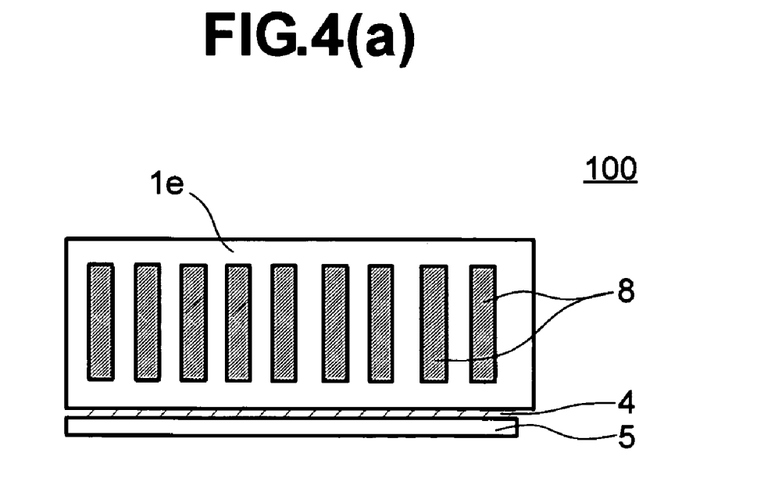
FIGS. 4(a) and 4(b) are views for explaining a liquid cooling jacket for use of cooling for an electronic apparatus, according to a second embodiment of the present invention.

FIG. 4(a) is a view of showing the liquid cooling jacket, according to a second embodiment, corresponding to that shown in FIG. 1 mentioned above.

Figure 4B:
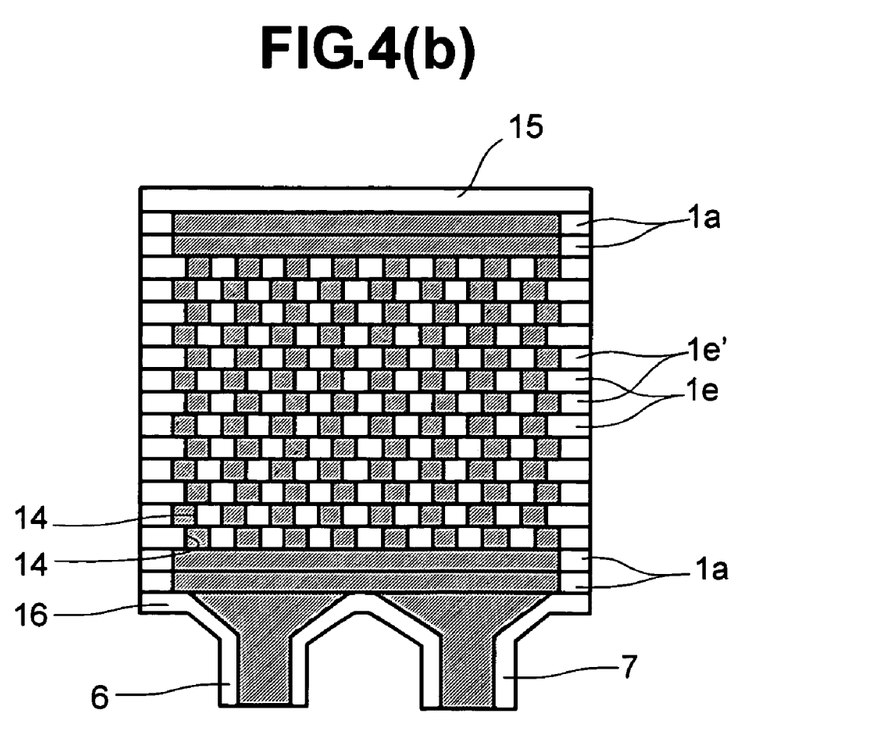

FIG. 4(b) is a cross-section view of the liquid cooling jacket, in particular, in a case that it is made up with piling up the lamination plates.

In FIG. 4(a), differing from that of the first embodiment, lamination plates 1e are piled up in the depth direction thereof. Moreover, on this lamination plates 1e, a plural number of holes, being also formed through the punching process, are shifted in one (1) direction (in the example shown in FIG. 4(a), being shifted into the left-hand side), as a whole thereof. And, in the present embodiment, those lamination plates 1e are piled up, being turned upside down with an each piece thereof.

In other words, since the shifting direction differs from that of the hole formed in each of the lamination plates 1e, the flow passage is meandered or zigzagged around.

In FIG. 4(b), a plural number of holes, which are punched out in the lamination plates 1e, are shifted a little bit with respect to the central shaft thereof, therefore it comes out as shown by 1e' in the figure, when turning the lamination plate 1e piled up next the lamination plate 1e upside down. Repeating the reversing lamination in this manner results into the forming of the flow passage 8 made up with a large number of overhang or expansive portions 14 therein.

In the present embodiment, a main body of the liquid cooling jacket 100 is formed, through brazing the lamination plates 1e and 1e' after being piled up, as a whole thereof, and thereafter, the inlet portion 6 and the outlet portion 7 for the cooling liquid are attached thereon. However, the main body and the inlet portion 6 and the outlet portion 7 for the cooling liquid may be formed in one body, also through the brazing.

A lower surface of the liquid cooling jacket 100 is connected with an upper surface of the semiconductor module 5, thermally, through a heat-conductive material having softness.

In such the structure, the cooling liquid flows within the inside of the flow passage 8 defined by the lamination plates 1e and 1e'. In this instance, the large number of overhand portions 14 functions as a cooling fin, and also it bring the flow of the cooling liquid to be complex, so as to promotes mixture thereof, therefore, it is possible to obtain a preferable cooling capacity or performance.

Also in the present embodiment, the lamination plates 1 reaches up to the portion of a fin base in contact with the heat-conductive member 4, therefore it is possible to eliminate the ill influence caused upon the heat transmission in the direction perpendicular to the base surface, due to the fact the brazing material has the heat conductivity lower than that of the fin material, comparing thereto. Accordingly, the inner thermal resistance can be obtained; being worth to that which can be obtained by a member of one (1) body, taking much cost for manufacturing thereof.

The liquid cooling jacket 100, basically, is built up with only one (1) kind of the lamination plate 1 punched out, including no such process in need of man-hour as needed in the cutting process; therefore, it has a merit that the cost necessary for manufacturing and for processing thereof can be reduced down, comparing to that in relation to the conventional arts. And, also, it is possible to maintain the liquid cooling jacket 100 to be thin in the thickness thereof.

Figure 5:
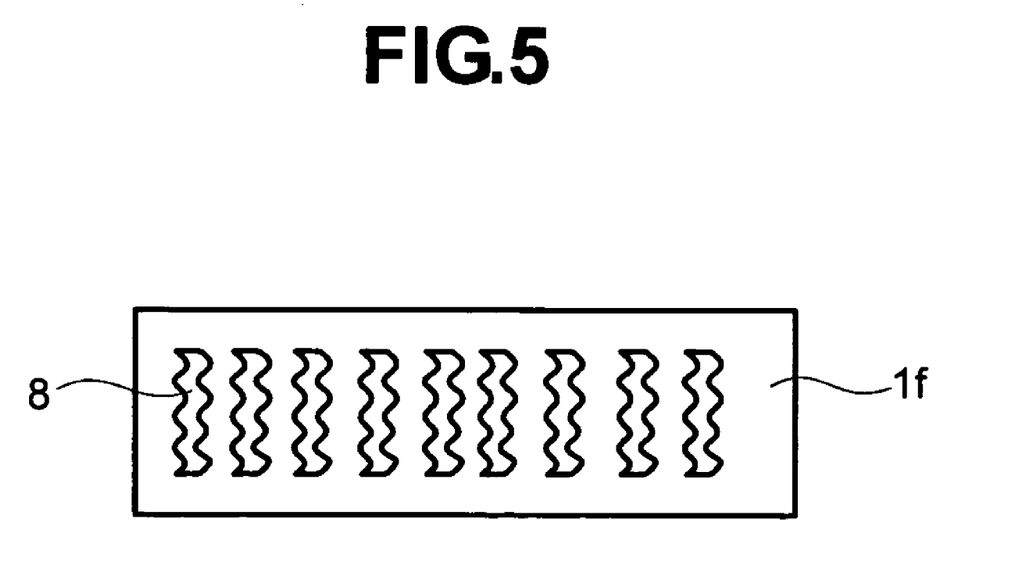
FIG. 5 is a front view of a variation of the lamination plate to be used in the first embodiment mentioned above.

FIG. 5 is a view for showing the lamination plates to be applied according to the second embodiment, in which a shape of the hole is altered.

In this FIG. 5, zigzagging of the holes in the shape, which are formed in the lamination plate 1f, results in an increase of the heat transfer area in a ratio to the thickness of the liquid cooling jacket 100. Further, reversing upside down when piling up the lamination plates 1 makes the flow within the flow passage 8 very complex, thereby obtaining the heat transfer being very high. For this reason, it is possible to obtain the liquid cooling jacket 100 having a very preferable cooling capacity or performance.

Also, the position of the pouching treated on the each lamination plate 1 is shifted a little bit from the central axis thereof, as was shown in FIG. 4 mentioned above, and it is piled up reversing upside down, and then the flow passage 8 comes to be complex, much more, and therefore the heat conductivity upon the surface of the flow passage 8 can be increased up to be higher.

[Embodiment 3]

Figure 6A:
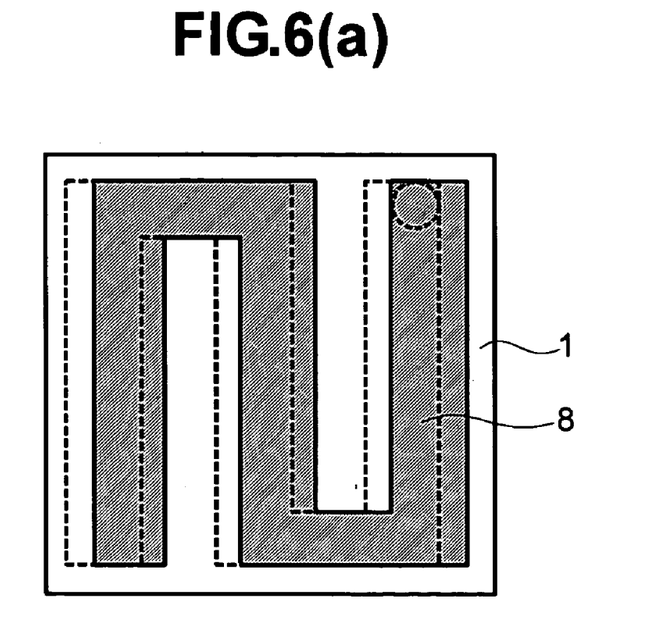
FIGS. 6(a) and 6(b) are views for explaining a liquid cooling jacket for use of cooling for an electronic apparatus, according to a third embodiment of the present invention.

FIG. 6(a) is the cross-sectional view of the liquid cooling jacket, according to a third embodiment.

Figure 6B:
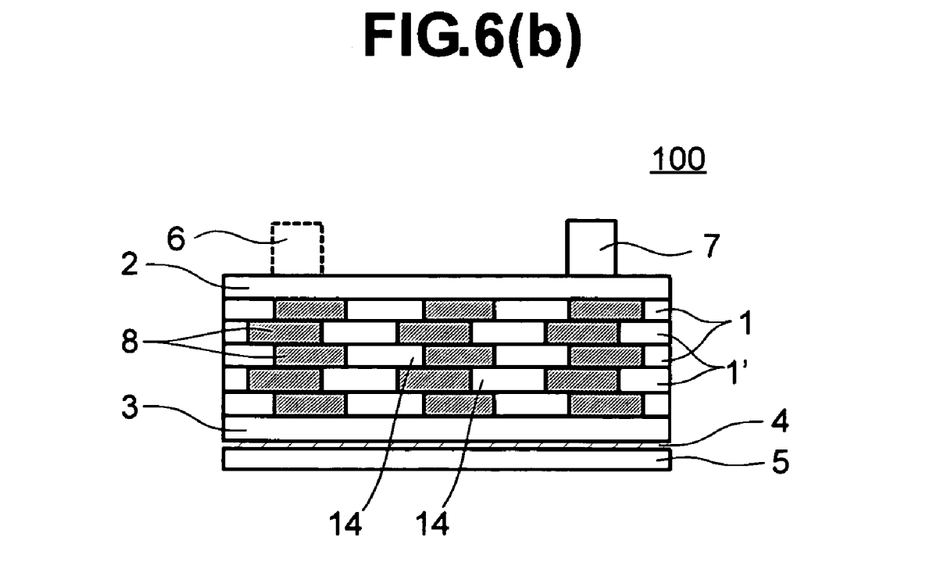

FIG. 6(b) is the cross-sectional view of the plates being piled up.

In FIG. 6(a), the lamination plates 1 and 1', in each of which the holes are formed in zigzagged manner (or, "S"-like shape) through the punching process, are piled up, one by one, each being reversed upside down. Dotted line in the figure depicts the lamination plates 1' being piled up after being reversed upside down. By means of those zigzag-shaped holes, there is made up the flow passage 8 for the cooling liquid.

The positions of punching out the holes on the lamination plates 1 are shifted a little bit from the central axis in the horizontal direction, therefore a large number of the overhang portions 14 are defined within the flow passage 8, when piling up the lamination plates 1e and 1e', alternately reversing upside down. On both ends of the lamination plates 1, 1' in the vertical direction thereof, there are provided an upper end plate 2 and a lower end plate 3. And, on the upper end plate 2 are provided the inlet portion 6 and the outlet portion 7 for the cooling liquid.

With the present embodiment, the main body of the liquid cooling jacket 100 is built up, through brazing the lamination plates 1 and 1', the upper end plate 2, and the lower end plate 3, as a whole, after filing them up in layers, and thereafter are attached with the inlet portion 6 and the outlet portion 7 for the cooling liquid thereon. However, it is possible to build up the main body together with the inlet portion 6 and the outlet portion for the cooling liquid, in one body through the brazing.

A lower surface of the liquid cooling jacket 100 is connected with an upper surface of the semiconductor module 5, thermally, through a heat-conductive material having softness.

With such the structure, the cooling liquid flows within the flow passage 8, which is defined between the upper end plate 2 and the lower end plate 3. In this instance, since the large number of hangover portions 14 are defined within the flow passage 8 so as to function as the cooling fins; therefore, it is possible to obtain a heat transfer area being large in the ratio of the thickness thereof, thereby obtaining a preferable cooling capacity or performance. The liquid cooling jacket 100, basically, is built up with only one (1) kind of the lamination plate 1 punched out, including no such process in need of man-hour as needed in the cutting process; therefore, it has a merit that the cost necessary manufacturing and processing thereof can be reduced down, comparing to that in relation to the conventional arts. And, it is also possible to maintain the liquid cooling jacket 100 to be thin in the thickness thereof.

[Embodiment 4]

Figure 7A:
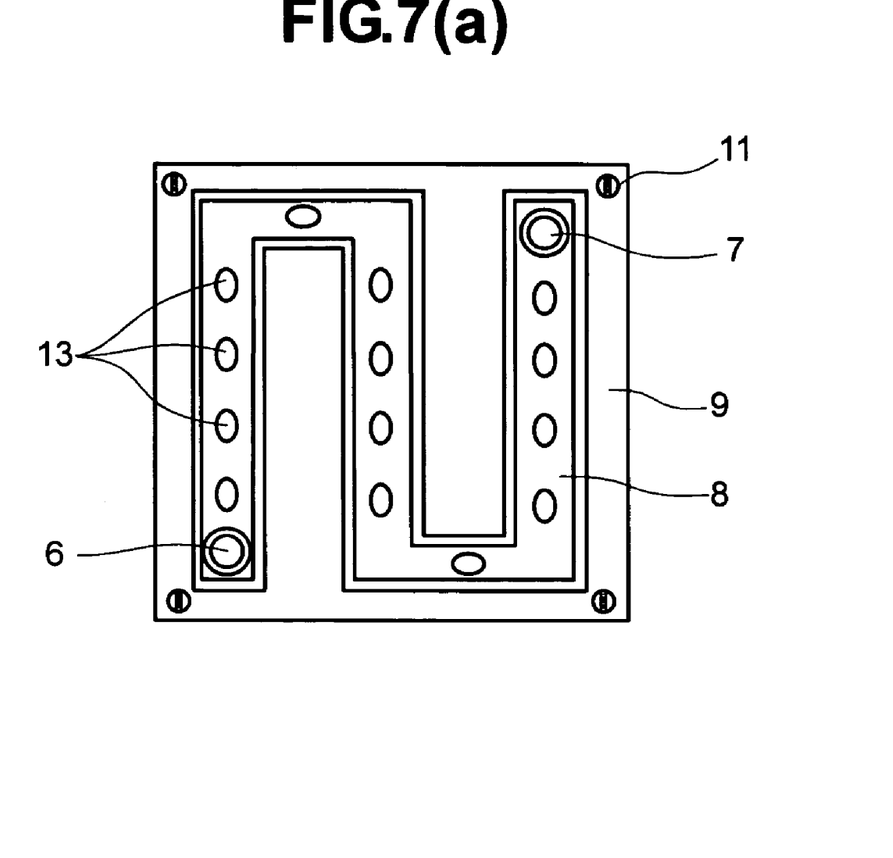
FIGS. 7(a) and 7(b) are views for explaining a liquid cooling jacket for use of cooling for an electronic apparatus, according to a fourth embodiment of the present invention.

FIG. 7(*a*) is an upper view of the liquid cooling jacket, according to a fourth embodiment.

Figure 7B:
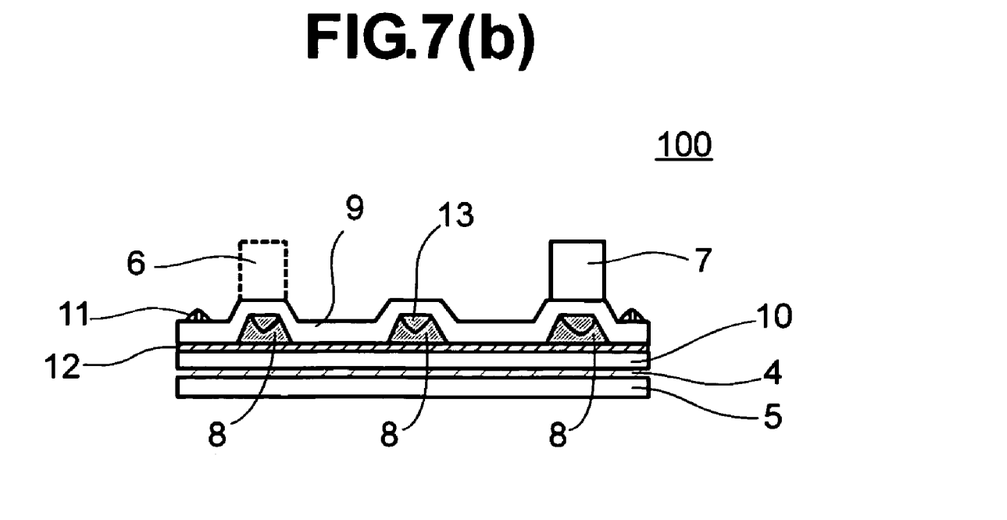

FIG. 7(*b*) is the cross-sectional view of the liquid cooling jacket, according to the fourth embodiment.

In FIG. 7(*a*), the liquid cooling jacket 100, according to the present embodiment, is made up with two (2) pieces of plates, and basically, it is made up with an upper lamination plate 9, which is formed through a press process, and a plate-like lower layer plate 10. In the upper lamination plate 9 is formed the flow passage 8 in a zigzag-like manner (or "S"-like shaped) through extrusion forming obtained by the press process, and further in this extrusion forming portion are formed a plural number of concave portions 13.

In FIG. 7(*b*), the upper lamination plate 9 and the lower lamination plate 10 are fixed with, through screws 11 while putting a packing rubber 12 therebetween. The inlet portion 6 and the outlet portion 7 of the cooling liquid are attached on the upper lamination plate 9, so that they are communicated with the flow passage mentioned above.

In this manner, the cooling liquid flows within the flow passage 8 defined between the upper lamination plate 9 and the lower lamination plate 10. In this instance, due to the function of the recesses 13 provided within the flow passage 9, the cooling liquid repeats meandering therein, thereby being enhanced or promoted on the mixing-up thereof. In this manner, since the flow passage 8 is flat and thin in the shape, and also with provision of the large number of recesses 13 thereon, it is possible to obtain a preferable heat conducting capacity or performance.

The liquid cooling jacket 100, since it includes no such process in need of man-hour as is needed in the cutting process, and further there is no necessity of the process for forming a sealing against leakage of liquid therethrough, such as, the brazing, therefore it brings about a merit that the costs needed for manufacturing and processing can be reduced down, greatly, comparing to the conventional technology. And, also, the thickness of the liquid cooling jacket 100 can be kept to be very thin in the thickness thereof.

[Embodiment 5]

Figure 8:
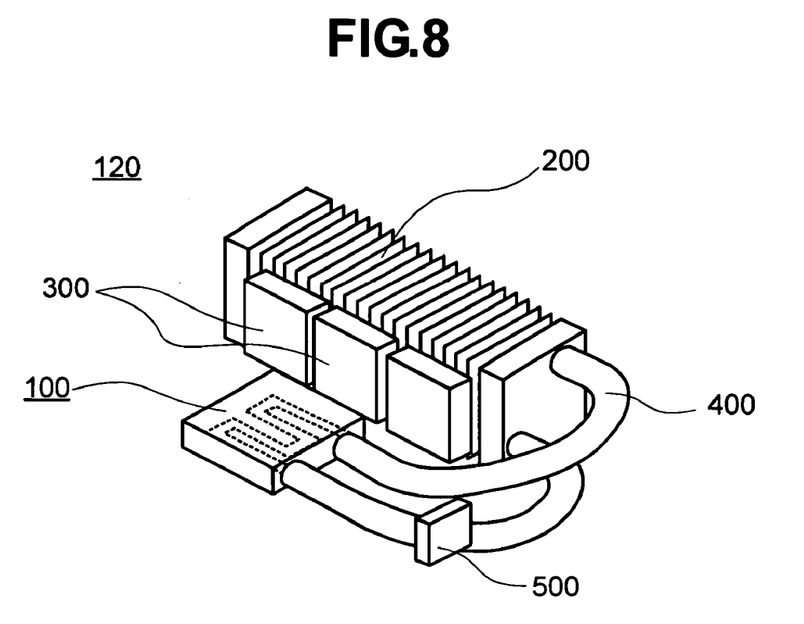
FIG. 8 is a perspective view of a liquid cooling system, according to a fifth embodiment of the present invention.

FIG. 8 is a perspective view of a liquid cooling system, according to a fifth embodiment.

In this FIG. 8, a liquid cooling system 120 is built up with a pump 500, a radiator 200, a liquid cooling jacket 100 and a fan 300 for use of cooling down the radiator, and also pipe 400, etc. Into this liquid cooling system 120 is installed the liquid cooling jacket, which was explained in either one of the embodiments; i.e., from the embodiment 1 to embodiment 4.

Figure 9:
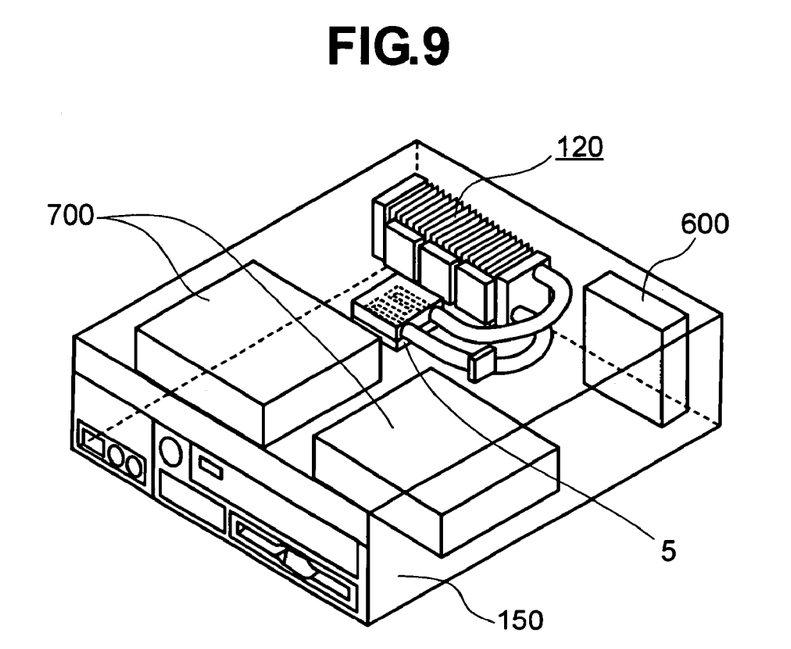
FIG. 9 is a perspective view of an electronic apparatus, installing therein the liquid cooling system according to the fifth embodiment mentioned above.

FIG. 9 is a perspective view of an electronic apparatus installing the liquid cooling system shown in FIG. 8 mentioned above.

In this FIG. 9, within the electronic apparatus 150, other than that, there are provided a large number of electronic parts 700 and a fan 600 for cooling thereof. In the present embodiment, the radiator 200 and the fan 300 for use of cooling of the radiator are disposed at the most downstream side within a housing 150 of the electronic apparatus.

By the way, in such the electronic apparatus, because of receiving a large number of electronic parts, etc., within an inside thereof, a space is limited for installing the liquid cooling system 12 therein. Accordingly, it has a problem to be dissolved, for such the liquid cooling system 120, to make the radiator 200 being small in the sized thereof, in particular, occupying the space thereof.

However, in general, excepting for a special case, it is impossible to paying a large amount of costs on the liquid cooling system itself. This problem cannot be achiever or dissolved, easily, by only directing the radiator 200 to be high in the performances or capacity thereof.

Thus, seeing the liquid cooling system 120 from a viewpoint of the entire thermal balance thereof, normally, the thermal resistance in the liquid cooling jacket 100, which is made up through the conventional manufacturing method, such as, the extrusion forming, for example, comes to be larger than that in the radiator 200.

For this reason, the high-performances or capacity of the radiator cannot be results into an increase of heat radiation, directly, by means of the radiator 200 itself, seeing from the system, as a whole; therefore it is impossible to reach the remarkable small-sizing thereof.

On the other hand, the liquid cooling jacket 100, according to the present embodiments, is low on the costs thereof and also in the thermal resistance therein; therefore, an effect of high-performances or capacity of the radiator 200 gives an influence upon an increase of the heat radiation capacity or performance of the radiator 200, directly, seeing from a viewpoint of the thermal balance upon the entirety of the liquid cooling system 120. For this, it is possible to make the radiator 200 to be small in sized thereof, greatly.

With such the structure within an inside of the hosing as shown in FIG. 9 mentioned above, the heat removed from the semiconductor module 5 having high heat-generation is discharged from the radiator 200 into an inside of the housing 150, however it faces onto an exit portion, it goes into the atmosphere as it is, but remaining within the housing 150. For this reason, the flow within the housing comes to be very smooth, thereby maintaining the cooling capacity or performance to be preferable, extremely. Also, the fan 300 for use of cooling the radiator also carries out the role of the discharge fan for the entirety of an inside of the housing 150, it distributes to the cooling of the other parts 700, too.

Though only showing the example, according to the present embodiment, in which the liquid cooling system is installed into a main body of the personal computer, for example, as is shown in FIG. 9 mentioned above, however since the liquid cooling system is compact in the sized as is shown in FIG. 8 mentioned above, therefore the field applicable of thereof is very wide, including the equipments and apparatus, which installs the semiconductor element having heat-generation therein, such as, a plasma television, a game machine, or a liquid crystal projector, etc.

As was mentioned in the above, according to the present invention, since it is very easy to form the lamination plates to be very thin in the thickness thereof, therefore it is possible to keep a large area for achieving the heat conduction therethrough. Also, the inner thermal resistance is very low, in respect to the heat transmission into the direction perpendicular to the base surface. Due to those effects, it is possible to obtain the cooling capacitor or performance thereof, being very preferable.

Thus, according to the present invention, it is possible to provide an electronic apparatus having the liquid cooling jacket for use of cooling and the system thereof, enabling promotion on the heat transmission within the flow passage itself.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

The invention claimed is:

1. A liquid cooling system comprising:
  a heat-receiving element, being thermally connected with a heat-generation part;
  a pump for transporting a liquid to said heat-receiving element; and
  a radiator for receiving heat from said heat-generation part with an aid of said pump, and for radiating heat of the liquid;
  wherein said heat-receiving element is made up with at least one lamination plate, being formed through punching process, and said at least one lamination plate comprises a flow passage, within which the liquid communicates and is provided with a cooling fin surface area; and
  wherein said at least one lamination plate includes a plurality of first lamination plates having at least one hole at a central portion thereof, and a plurality of second lamination plates having an opened cut-out portion at one end thereof and a hole at an other end thereof, and said first and second lamination plates are piled up alternately, thereby forming a lamination group of an inlet side of the liquid and another lamination group of an outlet side of the liquid.

2. A liquid cooling system, comprising:
  a heat-receiving element, being thermally connected with a heat-generation part;
  a pump for transporting a liquid to said heat-receiving element; and
  a radiator for receiving heat from said heat-generation part with an aid of said pump, and for radiating heat of the liquid;
  wherein said heat-receiving element is made up with at least one lamination plate, being formed through punching process, and said at least one lamination plate comprises a flow passage, within which the liquid communicates and is provided with a cooling fin surface area, and further said pump and said radiator are connected with said heat-receiving member through conduits; and
  wherein said at least one lamination plate includes a plurality of first lamination plates having at least one hole at a central portion thereof, and a plurality of second lamination plates having an opened cut-out portion at one end thereof and a hole at an other end thereof, and said first and second lamination plates are piled up alternately, thereby forming a lamination group of an inlet side of the liquid and another lamination group of an outlet side of the liquid.

3. The liquid cooling system, as described in the claim 2, wherein:
  a fin is attached onto said radiator.

* * * * *